United States Patent [19]

Gamoh

[11] 4,456,878
[45] Jun. 26, 1984

[54] ELECTRONIC WATTHOUR METER

[75] Inventor: Ryouji Gamoh, Yokohama, Japan

[73] Assignee: Tokyo Shibaura Denki Kabushiki Kaisha, Japan

[21] Appl. No.: 265,237

[22] Filed: May 19, 1981

[30] Foreign Application Priority Data

Jun. 4, 1980 [JP] Japan .................................. 55-75160

[51] Int. Cl.³ ........................ G01R 21/06; G01R 1/02
[52] U.S. Cl. .................................... 324/142; 324/130
[58] Field of Search ..................... 324/142, 130, 99 D, 324/120; 364/483

[56] References Cited

U.S. PATENT DOCUMENTS

| 3,070,786 | 12/1962 | MacIntyre | 324/130 |
| 3,955,138 | 5/1976 | Milkovic | 324/107 |

FOREIGN PATENT DOCUMENTS

| 1807581 | 5/1970 | Fed. Rep. of Germany . |
| 2348667 | 4/1975 | Fed. Rep. of Germany . |
| 2715321 | 10/1978 | Fed. Rep. of Germany . |
| 2715283 | 10/1978 | Fed. Rep. of Germany . |
| 2926979 | 1/1980 | Fed. Rep. of Germany . |
| 49-60468 | 6/1974 | Japan . |
| 49-60469 | 6/1974 | Japan . |
| 49-60470 | 6/1974 | Japan . |
| 52-9341 | 1/1977 | Japan . |

OTHER PUBLICATIONS

German DE-Z, "Internationale Elektron Rundschau", 1968, Nr. 12, S. 330.
German DE-Z: "Landis & Gyr-Mitteilungen", 19, 1972, Heft. 1, S. 9–16.
German DE-Z, "Siemens-Zeitschrift", 47, 1973, Heft 4, S. 280–283.

Primary Examiner—Ernest F. Karlsen
Attorney, Agent, or Firm—Finnegan, Henderson, Farabow, Garrett & Dunner

[57] ABSTRACT

An electronic watthour meter including a pulse width modulation circuit for converting a voltage signal proportional to the load voltage across the power supply lines to a pulse width duty cycle signal and a current-to-voltage converter for converting a current signal proportional to the load current across the power supply lines to a voltage signal. A multiplication circuit issues the product of the voltage signals under the control of the pulse width duty cycle signal as a pulse signal proportional to the instantaneous power consumption of the power supply lines. A filter circuit integrates the pulse signal of the multiplication circuit as an integrated voltage signal. A voltage-to-frequency converter converts the integrated voltage signal to a pulse signal proportional to the consumption power of the power supply lines. An automatic compensation circuit integrates the pulse signal of the voltage-to-frequency converter as a feedback signal to the input of the voltage-to-frequency converter thereby eliminating the inherent offset voltage caused by the pulse width modulation circuit, the current-to-voltage converter and the voltage-to-frequency converter.

3 Claims, 7 Drawing Figures

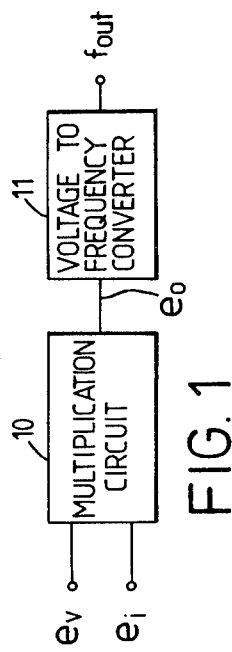
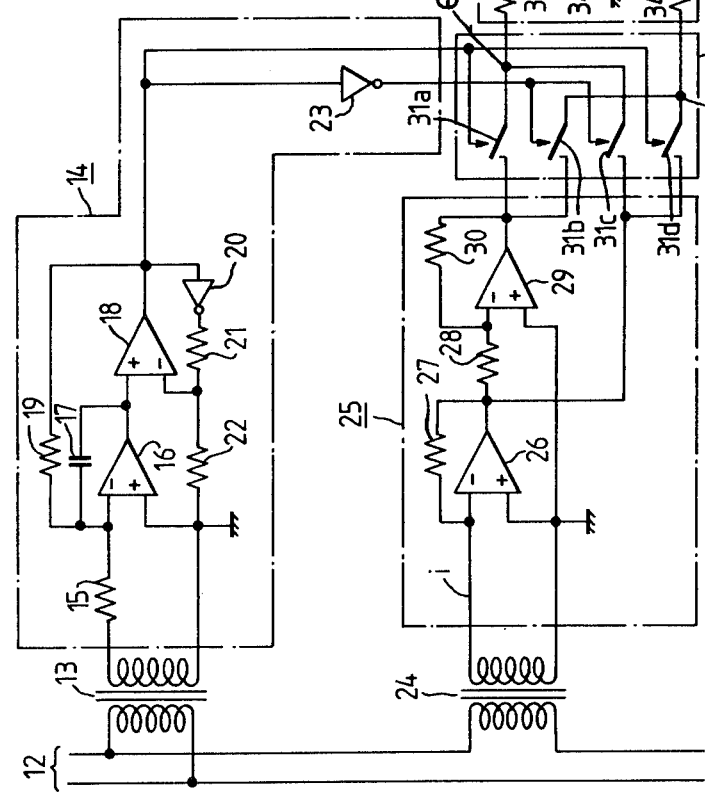
FIG. 1
FIG. 2

ELECTRONIC WATTHOUR METER

BACKGROUND OF THE INVENTION

This invention relates to electronic watthour meters, and more particularly to an electronic watthour meter in which its light load characteristic is improved and its characteristic with time is stabilized.

Since an electronic watthour meter has no mechanically movable components, its characteristic with time is more excellent than an induction type watthour meter which is essentially formed with mechanical components. Furthermore, its circuit is composed by integrated circuits, so that its size is small, it is suitable for mass production and the manufacturing cost can be reduced.

Accordingly, it seems that an electronic watthour meter will eventually replace the induction type watthour meter and will be the main type of watthour meter. A variety of electronic watthour meters have been proposed in the art.

These conventional electronic watthour meters have an equivalent circuit as shown in FIG. 1. Thus, the watthour meter comprises: a multiplication circuit 10 in which a voltage signal $e_v$, proportional to the load voltage of the power supply lines, and a voltage signal $e_i$, proportional to the consumption current of the power supply lines, are subjected to multiplication thereby to provide a voltage signal $e_o$ ($e_o = k \cdot e_v \cdot e_i$, where k is a constant) proportional to the instantaneous power of the supply lines; and a voltage-to-frequency converter 11 in which the output voltage signal $e_o$, of the multiplication circuit 10, is subjected to integration to provide a frequency signal $f_{out}$. Accordingly, the integrated power value of the supply lines can be obtained by counting the frequency signal $f_{out}$ outputted by the voltage-to-frequency converter 11.

The accuracy of the watthour meter is expressed by the absolute error with respect to a true measurement value instead of relative error with respect to the full scale (rating). In the watthour meter, the multiplication circuit 10 and the voltage-to-frequency converter 11 are made up of operational amplifiers. To obtain the high accuracy required by a watthour meter, an offset voltage of the multiplication circuit and the voltage-to-frequency converter must be suppressed within an extremely small value of voltage when the input of the watthour meter is small and its load is light. It is necessary that the offset voltage should be suppressed within the absolute error even if the input of the watthour meter is 1/30 (3.33%) of the rating (100%), 1/50 (2%) or 1/100 (1%). If it is assumed that the rating of the voltage signal Vi, proportional to the consumption current, is 5 V for instance, then the error of 0.5% corresponds to an input 25 mV in conversion value, with the rating being 100%. Therefore, if the input in conversion value is on the order of 25 mV, the accuracy will not be so seriously affected. However, the input in conversion value is 0.5 mV in the case of 0.5% error with respect to a 1/50 input. Accordingly, it is necessary that the offset voltage induced by the operational amplifiers in the multiplication circuit 10 and the voltage-to-frequency converter 11 will be reduced less than 0.5 mV. However, it is quite difficult to suppress the offset voltage within an extremely small value range or to eliminate it. In addition, the offset voltage is varied with time and temperature, so that the accuracy of measurement of power tends to be low.

SUMMARY OF THE INVENTION

It is one object of this invention to provide an electronic watthour meter which can measure consumption power accurately. According to this invention, an electronic watthour meter comprises: first means for detecting a voltage signal which is proportional to a load voltage of power supply lines; second means for detecting a voltage signal which is proportional to a load current of the power supply lines; a pulse width modulation circuit for subjecting the voltage signal from the first means to pulse width modulation to obtain a pulse width duty cycle signal; a multiplication circuit for outputting a pulse signal of the product of the voltage signal from the first means and the voltage signal from the second means with switching operation by the pulse width duty cycle signal; a filter circuit for integrating the pulse signal from the multiplication circuit to positive and negative DC voltages; a current-to-frequency converter for outputting a pulse signal of which the frequency is proportional to the DC voltages; and an automatic offset compensation circuit for applying a feedback signal, which is an integration voltage of an output signal of the voltage-to-frequency converter, to the voltage-to-frequency converter.

BRIEF DESCRIPTION OF THE DRAWINGS

FIG. 1 is a block diagram showing the fundamental arrangement of an electronic watthour meter;

FIG. 2 is a circuit diagram showing an example of an electronic watthour meter according to the invention;

DETAILED DESCRIPTION OF THE INVENTION

Figure 3:
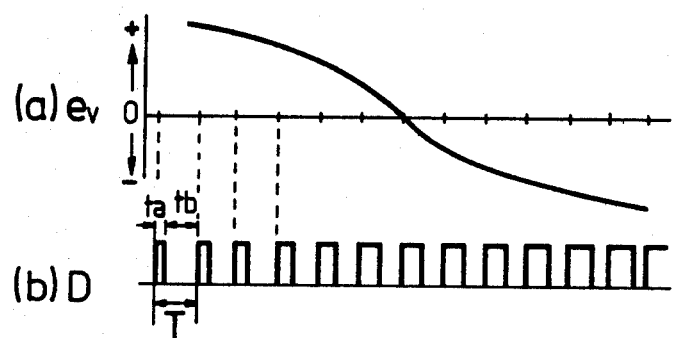
FIG. 3 is a waveform diagram for a description of the operation of the pulse width modulation circuit shown in FIG. 2.

FIG. 2 is a circuit diagram showing one example of an electronic watthour meter according to this invention.

As shown in FIG. 2, a voltage signal $e_v$, proportional to a load voltage across power supply lines 12, is detected by a potential transformer 13.

A pulse width modulation circuit (which is referred to hereinafter as "PWM circuit") 14 will be described hereinafter. One terminal of a resistor 15 is connected to one output of the potential transformer 13, and the other terminal is connected to the negative input of an operational amplifier 16. The positive input of the operational amplifier 16 is grounded. A capacitor 17 is interposed between the negative input of the operational amplifier 16 and the output of the same. The positive input of an operational amplifier 18 is connected to the output of the operational amplifier 16. A resistor 19 is interposed between the negative input of the operational amplifier 16 and the output of the operational amplifier 18. The input of an inverter circuit 20 is connected to the output of the operational amplifier 18. A resistor 21 is interposed between the output of the inverter circuit 20 and the negative input of the operational amplifier 18. A resistor 22 is interposed between the negative input of the operational amplifier 18 and the positive input of the operational amplifier 16. The input of an inverter 23 is connected to the output of the operational amplifier 18.

The PWM circuit 14, therefore, includes the resistors 15, 19, 21 and 22, the amplifiers 16 and 18, the capacitor 17, and the inverters 20 and 23.

The output of the PWM circuit 14 is a pulse width duty cycle signal D, and the inverted signal D is a pulse width duty cycle signal $\overline{D}$. These signals D and $\overline{D}$ can be expressed as follows:

$$D = \frac{e_r - e_v}{2 e_r} = \frac{t_a}{T} \tag{1}$$

$$\overline{D} = \frac{e_r + e_v}{2 e_r} = \frac{t_b}{T} \tag{2}$$

Where $e_r$ is the reference voltage which is applied to the negative input of the operational amplifier 18 of the PWM circuit 14, $e_v$ is the output voltage signal of the potential transformer 13, the time width $t_a$ is the interval of the logic signal "1" of the pulse width duty cycle signal D, the time width $t_b$ is the interval of the logic signal "0" of the signal $\overline{D}$ and the time T is the cycle of the signal D.

However, the equations (1) and (2) are correct when the offset voltage of the operational amplifier 16 is zero in ideal. In a practical circuit, there is an offset voltage of the operational amplifier 16. If the offset voltage of the operational amplifier 16 is $e_{oso}$, the pulse width duty cycle signals D and $\overline{D}$ are determined by the following equations in practice:

$$D = \frac{e_r - (e_v + 2e_{oso})}{2 e_r} \tag{3}$$

$$\overline{D} = \frac{e_r + (e_v - 2e_{oso})}{2 e_r} \tag{4}$$

The operational amplifier 18 outputs the pulse width duty cycle signal D and the pulse width duty cycle signal $\overline{D}$ is outputted from the output of the inverter circuit 23. FIG. 3(a) is a waveform diagram of the voltage signal $e_v$ outputted by the potential transformer 13. FIG. 3(b) is a waveform diagram of the pulse width duty cycle signal D. In FIG. 3(b), the time width $t_a$ is the interval of the logic signal "1" and the time width $t_b$ is the interval of the logic signal "0".

A current signal i, proportional to a load current across the power supply lines 12, is detected by a current transformer 24.

A current-to-voltage converter 25 will be described hereinafter. An output of the current transformer 24 is connected to the negative input of an operational amplifier 26, and other output is connected to the positive input of the operational amplifier 26 and is grounded. A resistor 27 is interposed between the negative input of the operational amplifier 26 and the output of the same. The output of the operational amplifier 26 is connected to the negative input of an operational amplifier 29 through a resistor 28. The positive input of the operational amplifier 29 is grounded. A resistor 30 is interposed between the negative input of the operational amplifier 29 and the output of the same. The converter 25 includes the amplifiers 26 and 29 and the resistors 27, 28 and 30.

The current signal i outputted from the current transformer 24 is converted to a voltage signal $(-e_i)$ by the operational amplifier 26. The voltage signal $(-e_i)$ is proportional to an absolute value of the current signal i. The voltage signal $(-e_i)$ is converted to a voltage signal $(+e_i)$, proportional to the current signal i, by the operational amplifier 29 which has the amplification of $(-1)$. The resistance of the resistor 28 is equal to that of the resistor 30 so that the operational amplifier 29 has the amplification of $(-1)$. The current signal i of the current transformer 24 is directly applied to the operational amplifier 26. According to the feedback action of the operational amplifier 26, the output voltage of the current transformer 24 is nearly zero. As a result, a current transformer having a core the permeability $\mu$ of which is small can be used and the phase difference between the input signal and the output signal of the current transformer is small.

A multiplication circuit 31, comprising 4 analog switches, will be described hereinafter. Two analog switches 31a and 31b are connected to the output of the operational amplifier 29. Two analog switches 31c and 31d are connected to the output of the operational amplifier 26. Each gate of the analog switches 31a and 31d is connected to the operational amplifier 18, and each gate of the analog switches 31b and 31c is connected to the output of the inverter circuit 23. The outputs of the analog switches 31a and 31c are connected to each other, and those of the analog switches 31b and 31d are connected to each other.

The analog switches 31a, 31b, 31c and 31d are made of semiconductor devices such as junction field effect transistors or MOS field effect transistors.

The pulse width duty cycle signal D is applied to the gates of the analog switches 31a and 31d, and a logic signal "1" of the pulse width duty cycle signal D drives the analog switches 31a and 31d. The voltage signals $(-e_i)$ and $(+e_i)$, proportional to the load current of the power supply lines, are applied from the operational amplifiers 26 and 29 to the inputs of the analog switches 31a and 31d. The pulse width duty cycle signal $\overline{D}$ from the PWM circuit 14 is applied to the gates of the analog switches 31b and 31c. A logic signal "1" of the pulse width duty cycle signal $\overline{D}$ drives the analog switches 31b and 31c, and the voltage signals $(-e_i)$ and $(+e_i)$ are applied to the inputs of the analog switches 31b and 31c. Accordingly, the analog switches 31b and 31d output an instantaneous voltage signal $e_{op}$. That is, the pulse width duty cycle signals D and $\overline{D}$ of the PWM circuit 14 drive the analog switches 31a, 31b, 31c and 31d. The instantaneous voltage signal $e_{op}$ or $e_{on}$ is the product of the voltage signal $e_v$, proportional to the load voltage of the power supply lines, and the voltage signals $(+e_i)$ and $(-e_i)$, proportional to the load current. The voltage signals $e_{op}$ and $e_{on}$ can be expressed as follows:

$$e_{op} = e_i \cdot D + (-e_i)\overline{D} \tag{5}$$

$$e_{on} = e_i \cdot D + (-e_i)\overline{D} \tag{6}$$

When a DC offset voltage of the operational amplifier 26 is $e_{os1}$ and that of the operational amplifier 29 is $e_{os2}$, the voltage signals $e_{op}$ and $e_{on}$ can be expressed as follows:

$$e_{op} = (e_i + e_{os2}) \cdot D + (-e_i + e_{os1}) \cdot \overline{D} \quad (7)$$

$$e_{on} = (e_i + e_{os2}) \cdot D + (-e_i + e_{os2}) \cdot \overline{D} \quad (8)$$

If the equations (3) and (4) are substituted into the equations (7) and (8), then $$e_{op} = (e_i + e_{os2}) \left\{ \frac{e_r + (e_v - 2e_{os0})}{2 e_r} \right\} + \quad (9)$$

$$(-e_i + e_{os1}) \left\{ \frac{e_r - (e_v + 2e_{os0})}{2 e_r} \right\} = \frac{e_i \cdot e_v}{e_r} +$$

$$\frac{(e_{os1} + e_{os2})e_r + (e_{os2} - e_{os1})e_v - 2(e_{os1} + e_{os2})e_{os0}}{2 e_r}$$

$$e_{on} = (e_i + e_{os2}) \left\{ \frac{e_r - (e_v + 2e_{os0})}{2 e_r} \right\} + \quad (10)$$

$$(-e_i + e_{os1}) \left\{ \frac{e_r + (e_v - 2e_{os0})}{2 e_r} \right\} = \frac{-e_i e_v}{e_r} +$$

$$\frac{(e_{os1} + e_{os2})e_r + (e_{os1} - e_{os2})e_v - 2(e_{os1} + e_{os2})e_{os0}}{2 e_r}$$

As is obvious from the equations (9) and (10), the first term is the value of the instantaneous power and the second term is the error which is caused by the DC offset voltage of the operational amplifiers 16, 26 and 29 in the PWM circuit 14 and the current-to-voltage converter 25.

Figure 4:
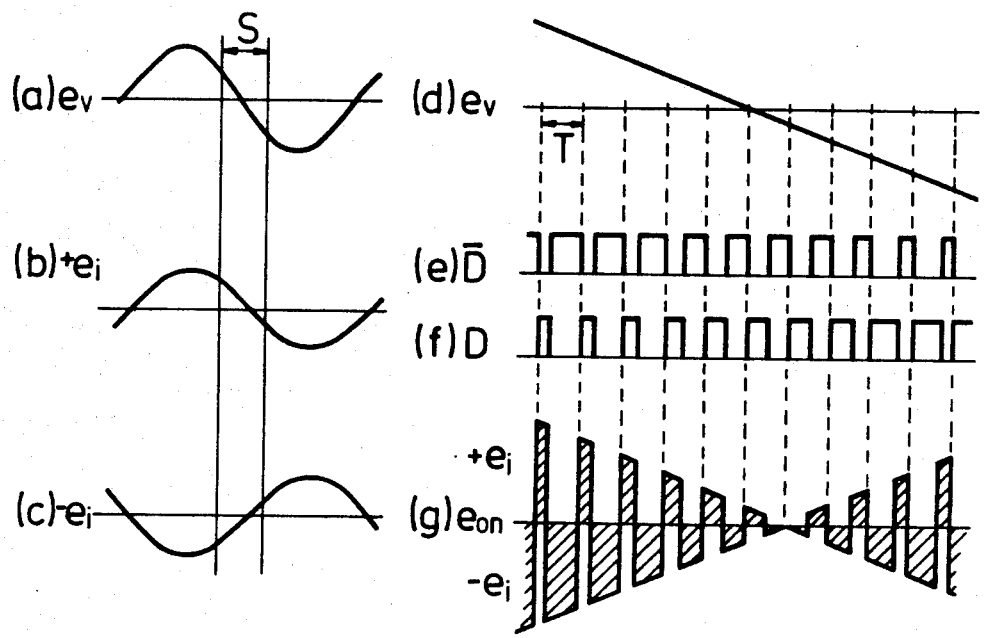
FIG. 4 is a waveform diagram for a description of the operation of the pulse width modulation circuit and a mutiplication circuit shown in FIG. 2.

FIG. 4(a) is a waveform diagram of the voltage signal $e_v$, from the potential transformer 13, which is proportional to the load voltage of the power supply lines. FIGS. 4(b) and (c) are waveform diagrams of the voltage signals $(+e_i)$ and $(-e_i)$, from the current-to-voltage converter 25, which is proportional to the load current of the power supply lines. FIG. 4(d) is a waveform that is a part of the voltage signal $e_v$ for the period S in the part of FIG. 4(a). FIGS. 4(e) and (f) are waveform diagrams of the pulse width duty cycle signals $\overline{D}$ and D. FIG. 4(g) is a waveform diagram of the instantaneous power signal $e_{on}$. In FIG. 4(d), T is the period of the pulse width duty cycle signals $\overline{D}$ and D.

A low-pass filter circuit 32, including resistors 33a and 33b and capacitors 34a and 34b, will be described hereinafter. A terminal of resistor 33a is connected to the outputs of the analog switches 31a and 31c. The other terminal of the resistor 33a is connected to a terminal of capacitor 34a. A terminal of resistor 33b is connected to the output of the analog switches 31b and 31d. The other terminal of the resistor 33b is connected to a terminal of capacitor 34b. The other terminals of the capacitors 34a and 34b are grounded. The resistance of the resistor 33a is equal to that of the resistor 33b. The capacitance of the capacitor 34a is equal to that of the capacitor 34b.

The instantaneous voltage signals $e_{op}$ and $e_{on}$ of the multiplication circuit 31 are integrated by the low-pass filter circuit 32. The low-pass filter circuit 32 outputs DC voltage signals $\overline{e_{op}}$ and $\overline{e_{on}}$ which include two components of the instantaneous voltage and the inherent offset voltages $e_{os0}$, $e_{os1}$ and $e_{os2}$ of the PWM circuit 14 and the current-to-voltage converter 25. The number of the time division in the PWM circuit 14 is m. By the on and off control of the PWM circuit 14, the instantaneous voltage signals at each time of the time division, $1, 2 \sim m$ are $e_{op1}, e_{op2} \sim e_{opm}$ and $e_{on1}, e_{on2} \sim e_{onm}$. The DC output voltages of the low-pass filter circuit 32 can be expressed as follows:

$$\overline{e_{op}} = \frac{e_{op1} + e_{op2} + e_{op3} + \ldots + e_{opm}}{m} \quad (11)$$

$$\overline{e_{on}} = \frac{e_{on1} + e_{on2} + e_{on3} + \ldots + e_{onm}}{m} \quad (12)$$

Really, the number m of the time division will be regarded as the infinite. And, the infinite integration of the voltage signal $e_v$ will be regarded as zero. That is, $$\int_0^\infty e_v dt = 0 \quad (13)$$

From the equations (9) (13), the voltage signals $\overline{e_{op}}$ and $\overline{e_{on}}$ can be expressed as follows:

$$\overline{e_{op}} = \frac{\overline{e_i \cdot e_v}}{e_r} + \left\{ \frac{(e_{os1} + e_{os2})}{2} - \frac{(e_{os1} + e_{os2})e_{os0}}{e_r} \right\} \quad (14)$$

$$\overline{e_{on}} = \frac{-\overline{e_i \cdot e_v}}{e_r} + \left\{ \frac{(e_{os1} + e_{os2})}{2} - \frac{(e_{os1} + e_{os2})e_{os0}}{e_r} \right\} \quad (15)$$

From the equations (14) and (15), the first terms are equal in absolute value and are positive and negative DC voltage signals. The second terms of these equations are the inherent offset voltages from the operational amplifiers 16, 26 and 29.

Figure 5:
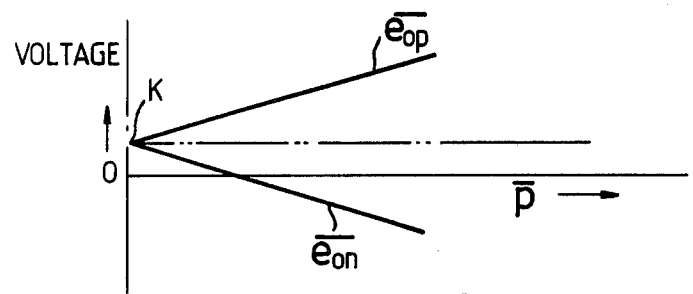
FIG. 5 is an input-output characteristic graph of the voltage signals $e_{op}$ and $e_{on}$.

FIG. 5 is an input-output characteristic graph of the DC voltage signals $\overline{e_{op}}$ and $\overline{e_{op}}$ from the equations (14) and (15). In this characteristic graph, the abscissa represents $$\overline{p} = \left( \frac{\overline{e_i \cdot e_v}}{e_r} \right)$$

and the ordinate represents the output voltages $\overline{e_{op}}$ and $\overline{e_{on}}$. The constant K is the inherent offset voltage $$\left\{ \frac{(e_{os1} + e_{os2})}{2} - \frac{(e_{os1} + e_{os2})e_{os0}}{e_r} \right\}$$

A voltage-to-frequency converter 35 will be described hereinafter. An input of an analog switch 36a is connected to the connection terminal of the resistor 33a and the capacitor 34a of the low-pass filter circuit 32. An input of an analog switch 36b is connected to the connection terminal of the resistor 33b and the capacitor 34b of the low-pass filter circuit 32. Outputs of the analog switches 36a and 36b are connected commonly. A terminal of a resistor 37 is connected to the connection terminal of the analog switches 36a and 36b. The other terminal of the resistor 37 is connected to the negative input of an operational amplifier 38. The positive input of the operational amplifier 38 is grounded. A capacitor 39 is interposed between the negative input and the output of the operational amplifier 38. The positive input of an operational amplifier 40 is connected to the output of the operational amplifier 38. A resistor 41 is interposed between the positive input of the operational amplifier 38 and the negative input of the operational amplifier 40. The input of an inverter circuit 42 is connected to the output of the operational amplifier 40. A resistor 43 is interposed between the negative input of the operational amplifier 40 and the output of the inverter circuit 42. The input of an inverter circuit 44 is connected to the output of the operational amplifier 40. The output of the inverter circuit 44 is connected to a gate of the analog switch 36b. The output of the operational amplifier 40 is connected to a gate of the analog switch 36a. A terminal of a resistor 45 is connected to the negative input of the operational amplifier 38. The voltage-to-frequency converter 35 therefore includes analog switches 36a and 36b, resistors 37, 41, 43 and 45, amplifiers 38 and 40, capacitor 39, and inverters 42 and 44.

The resistance of the resistor 37 is much greater than the resistance of the resistors 33a and 33b of the low-pass filter 32. And, the resistance of the resistor 41 is equal to the resistance of the resistor 43.

The on-off operations of the analog switches 36a and 36b connected to the input of the operational amplifier 38 which operates as an integration circuit are controlled by the output voltage signal of the operational amplifier 40 which is operated as a comparator circuit. The on-off operations of the analog switches 36a and 36b are asynchronous with that of the analog switches 31a, 31b, 31c and 31d of the multiplication circuit 31.

Figure 6:
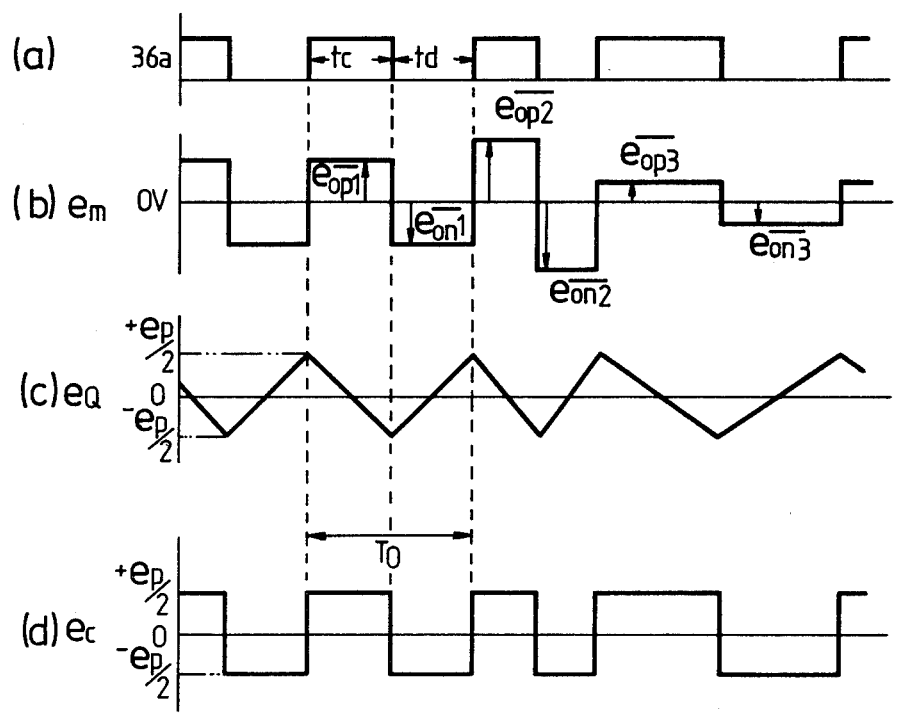
FIG. 6 shows waveforms at various parts of the voltage-to-frequency converter shown in FIG. 2.

FIG. 6(a) is a waveform diagram of the analog switch 36a when it is closed. FIG. 6(b) is a waveform diagram of a voltage signal $e_m$ from the connection of the outputs of the analog switches 36a and 36b. FIG. 6(c) is a waveform diagram of a voltage signal $e_a$ from the operational amplifier 38. FIG. 6(d) is a waveform diagram of the standard voltage $e_c$ applied to the negative input of the operational amplifier 40. In FIG. 6(a), $t_c$ and $t_d$ show the on time of the analog switches 36a and 36b. In FIG. 6(b), $\overline{e_{op1}}, \overline{e_{op2}}, \ldots$ and $\overline{e_{on1}}, \overline{e_{on2}}, \ldots$ are the DC voltage of the low-pass filter circuit 32 by the on and off control of the analog switches 36a and 36b. In FIGS. 6(c) and (d), $(+^ep/2)$ and $(-^ep/2)$ are the standard voltages applied to the negative input of the operational amplifier 40. In FIG. 6(d), To is the time ($t_c + t_d$).

By the on and off operations of the analog switches 36a and 36b which are shown in FIG. 6(a), the voltage signal $e_m$ which is shown in FIG. 6(b) is obtained from the output of the analog switches 36a and 36b. The voltage signal shown in FIG. 6(c) is obtained from the operational amplifier 38 as an integration circuit. This triangular signal is applied to the positive input of the operational amplifier 40. The voltage signal $e_c$ is applied to the negative input of the operational amplifier 40, for comparison. As shown in FIG. 6(d), the voltage signal $e_c$ is $(-^ep/2)$ in the interval $t_c$ when the analog switch 36b is on. The voltage signal $e_c$ is $(+^ep/2)$ in the interval $t_d$ when the analog switch 36a is on. Accordingly, as the positive DC voltage $\overline{e_{op}}$ is applied to the operational amplifier 38 in the interval $t_c$, the output voltage of it shows the down characteristics shown in FIG. 6(c).

When the integration output voltage $^eQ$ reaches $(-^ep/2)$, the output logic signal $^ef$ is inverted. After that, the analog switch 36b is cut off and the analog switch 36a is on, and the operation at the interval $t_d$ starts. At the interval $t_d$, the negative DC voltage is applied to the operational amplifier 38 and the output voltage of it shows the up characteristic shown in FIG. 6(c). When the integration output voltage $^eQ$ reaches $(+^ep/2)$, the output logic signal $^ef$ is inverted. Consequently, the analog switch 36a is cut off and the analog switch 36a is on again, and the operation at the interval $t_c$ starts.

Accordingly, the invention period To of the output logic signal $^ef$ of the operational amplifier 40 can be expressed as follows:

$$To = t_c + t_d \tag{16}$$

where $t_c$ is the on interval of the analog switch 36b and $t_d$ is the on interval of the analog switch 36a. Therefore, the output frequency $f_o$ of the logic signal $^ef$ can be expressed as follows:

$$f_o = \frac{1}{To} = \frac{1}{t_c + t_d} \tag{17}$$

The on intervals of $t_c$ and $t_d$ will be decided hereinafter. While the interval $t_c$, the output voltage of the operational amplifier 38 is $^eQ(t_c)$, and the output voltage of it is $^eQ(t_d)$ while the interval is $t_d$. The resistance of the resistor 37 is $R_2$, and the capacitance of the capacitor 39 is $C_2$, and the offset voltage of the operational amplifier 38 is $^e{os3}$. The output voltage $^eQ(t_c)$ can be expressed as follows:

$$^eQ(t_c) = -\left\{ \frac{1}{R_2 C_2} \int^{t_c} (\overline{e_{op}} + e_{os3}) dt \right\} = \tag{18}$$

$$-t_c \left( \frac{\overline{e_{op}} + e_{os3}}{R_2 C_2} \right)$$

$$t_c = \frac{-^eQ(t_c) \cdot R_2 C_2}{\overline{e_{op}} + e_{os3}} \tag{19}$$

Obviously, as shown in FIG. 6(c), the output voltage signal $^eQ(tc)$ decreases from $(+^ep/2)$ to $(-^ep/2)$.

$$-^eQ(tc) = ^ep \tag{20}$$

From the equations (19) and (20), the interval tc can be expressed as follows:

$$tc = \frac{e_p \cdot R_2 C_2}{\overline{e_{op}} + e_{os3}} \tag{21}$$

Similarly, $$^eQ(t_d) = -\left\{ \frac{1}{R_2 C_2} \int^{t_d} (\overline{e_{on}} + e_{os3}) dt \right\} = \tag{22}$$

-continued $$td = \frac{{}^eQ(td) \cdot R_2 C_2}{-(\overline{{}^e on} + {}^e os_3)} \quad -td\left(\frac{\overline{{}^e on} + {}^e os_3}{R_2 C_2}\right) \quad (23)$$

$$^eQ(td) = {}^ep \quad (24)$$

From the equations (23) and (24), the interval td can be expressed as follows:

$$td = \frac{{}^ep \cdot R_2 \cdot C_2}{-(\overline{{}^e on} + {}^e os_3)} \quad (25)$$

If the equations (14) and (15) are substituted into the equations (21) and (25), then $$tc = \frac{{}^ep R_2 C_2}{\frac{\overline{e_i e_v}}{e_r} + \left\{\frac{({}^e os_1 + {}^e os_2)}{2} - \frac{({}^e os_1 + {}^e os_2){}^e os_0}{e_r} + {}^e os_3\right\}} \quad (26)$$

$$td = \frac{{}^ep R_2 C_2}{\frac{\overline{e_i e_v}}{e_r} - \left\{\frac{({}^e os_1 + {}^e os_2)}{2} - \frac{({}^e os_1 + {}^e os_2){}^e os_0}{e_r} + {}^e os_3\right\}} \quad (27)$$

From the equations (26) and (27), if the component of the inherent offset voltage is $^e os_T$, then $$^e os_T = \frac{{}^e os_1 + {}^e os_2}{2} - \frac{({}^e os_1 + {}^e os_2){}^e os_0}{e_r} + {}^e os_3 \quad (28)$$

From the equations (26), (27) and (28), the intervals tc and td can be expressed as follows:

$$tc = \frac{{}^ep \cdot R_2 C_2}{\frac{\overline{e_i \cdot e_v}}{e_r} + {}^e os_T} \quad (29)$$

$$td = \frac{{}^ep \cdot R_2 C_2}{\frac{\overline{e_i \cdot e_v}}{e_r} - {}^e os_T} \quad (30)$$

The frequency $f_o$ of the logic signal $e_f$ from the voltage-to-frequency converter 35 is 1/(tc+td). If the offset voltage $^e os_T$ is zero, the frequency $f_o$ can be expressed as follows:

$$f_o = \frac{\overline{e_i \cdot e_v}}{2 \, e_r \cdot {}^ep \cdot R_2 \cdot C_2} \quad (31)$$

As is obvious from the equation (31), since $e_r$, $^ep$, $R_2$ and $C_2$ are all constant, the output frequency $f_o$ is correctly proportional to the DC voltage $\overline{e_i \cdot e_v}$, that is the consumption power.

From the equations (29) and (30), (A) If the offset voltage $^e os_T$ is zero, $^tc$ is equal to $^td$.

(B) If the offset voltage $^e os_T$ is positive, $^tc$ is smaller than td.

(C) If the offset voltage $^e os_T$ is negative, tc is greater than td.

If the offset voltage is not zero, the frequency $f_o$ can be expressed as follows:

$$f_o = \frac{\left(\frac{\overline{e_i \cdot e_v}}{e_r}\right)^2 - {}^e os_T^2}{2\left(\frac{\overline{e_i \cdot e_v}}{e_r}\right) \cdot {}^ep \cdot R_2 \cdot C_2} \quad (32)$$

Under the condition $$\frac{\overline{e_i \cdot e_v}}{e_r} \gg {}^e os_T,$$

the frequency $f_o$ scarcely includes the error. When $$\frac{\overline{e_i \cdot e_v}}{e_r}$$

is small, at the time of light load, the offset voltage $^e os_T$ causes the frequency error.

An automatic offset compensation circuit 46 including an amplifier, a resistor and a capacitor, will be described hereinafter. A terminal of a resistor 47 is connected to the output of the inverter circuit 42 of the voltage-to-frequency converter 35. The other terminal of the resistor 47 is connected to the negative input of an operational amplifier 48. The positive input of the operational amplifier 48 is grounded. A capacitor 49 is interposed between the negative input and the output of the operational amplifier 48. The output of the operational amplifier 48 is connected to the negative input of the operational amplifier 38 through the resistor 45 of the voltage-to-frequency converter 35.

The operational amplifier 48 operates as an integration circuit. Its time constant is much greater than that of the operational amplifier 38, operating as an integration circuit, of the voltage-to-frequency converter 35. Accordingly, the operational amplifier 38 compensates to make the offset voltage of the voltage-to-frequency converter 35 zero.

From the items (A), (B) and (C) (which are aforementioned), the operation of the compensation is made by the feedback loop on the voltage-to-frequency converter 35. The logic signal $^e f$ is inverted to the voltage signal $^e q$ of the inverter circuit 42 of the voltage-to-frequency converter 35. The voltage signal $^e q$ has a positive or negative amplitude. The resistance of the resistor 47 is R4. The capacitance of the capacitor 49 is C3. The on time of the analog switch 36b is tc. The on time of the analog switch 36a is td. The output voltage $^e nf$ of the operational amplifier 48 can be expressed as follows:

$$^e nf = \frac{1}{R_4 C_3}\left[\int^{tc}(-{}^e q)dt + \int^{td}({}^e q)dt\right] \quad (33)$$

If the condition is $R_4 \cdot C_3 \gg tc, td$, the equation (33) will become as follows:

$$e_{nf} = -(-tc \cdot e_q + td \cdot e_q)/R_4 C_3 = (tc \cdot e_q - td \cdot e_q)/R_4 C_3 \quad (34)$$

If the equations (29) and (30) are substituted into the equation (34), then $$e_{nf} = \left\{ \left( \frac{e_p R_2 C_2}{\frac{e_i e_v}{e_r} + e_{osT}} \right) \cdot e_q - \left( \frac{e_p R_2 C_2}{\frac{e_i e_v}{e_r} - e_{osT}} \right) \cdot e_q \right\} / R_4 C_3 \quad (35)$$

From the equation (35),
(D) If the offset voltage $e_{osT}$ is equal to zero, the voltage signal $e_{nf}$ is zero.
(E) If the offset voltage $e_{osT}$ is positive, the voltage signal $e_{nf}$ is negative.
(F) If the offset voltage $e_{osT}$ is negative, the voltage signal $e_{nf}$ is positive.

The feedback voltage $e_{nf}$ is applied to the negative input of the operational amplifier 38. Though the offset voltage $e_{osT}$ is high, the voltage $e_{nf}$ automatically cancels the offset voltage $e_{osT}$. Accordingly, the interval tc is always equal to the interval td.

A display device 50 indicates the frequency $f_o$ of the logic signal $e_f$ of the voltage-to-frequency converter 35.

The operation of this example will be described hereinafter. As shown in FIG. 4(a), the load voltage of the power supply lines is converted to the voltage signal $e_v$, proportional to the load voltage, by the potential transformer 13. As shown in FIG. 4(d), (e) and (f), this voltage signal $e_v$ is converted to the pulse width duty cycle signal D, proportional to the amplitude of the voltage signal $e_v$, by the PWM circuit 14 and this pulse width duty cycle signal D is inverted to the pulse width duty cycle signal $\overline{D}$.

On the other hand, the load current of the power supply lines is converted to the current signal i, proportional to the load current, by the current transformer 24. As shown in FIGS. 4(b) and (c), the current signal i is converted to the voltage signal $(+e_i)$ which is different by 180° from the voltage signal $(-e_i)$ by the current-to-voltage converter 25.

The voltage signal $(+e_i)$ is applied to the analog switches 31a and 31b of the multiplication circuit 31. On the other hand, the voltage signal $(-e_i)$ is applied to the analog switches 31c and 31d. And, the pulse width duty cycle signal D of the PWM circuit 14 is applied to the gates of the analog switches 31a and 31d, and the pulse width duty cycle signal $\overline{D}$ is applied to the gates of the analog switches 31b and 31c. As shown in FIG. 4(g), the instantaneous voltage signal $e_{on}$ can be obtained at the connection of the outputs of the analog switches 31a and 31c. And, the instantaneous voltage signal $e_{op}$ can be obtained at the outputs of the analog switches 31b and 31d of the multiplication circuit 31.

According to the process of this operation, the multiplication of the voltage signal $e_v$ and $(\pm e_i)$ can be done. The instantaneous voltage signals $e_{on}$ and $e_{op}$ comprises the component $|\pm e_i \cdot e_v|$, proportional to the instantaneous power, and the component of the DC offset voltage. The instantaneous voltage signal $e_{on}$ is applied to the resistor 33a of the low-pass filter circuit 32, and the voltage signal $e_{op}$ is applied to the resistor 33b of the filter circuit 32. Consequently, the instantaneous voltage signals $e_{op}$ and $e_{on}$ are integrated by the filter circuit 32, and the variation components of the offset voltage are eliminated. The integration voltage of the voltage signals $e_{op}$ and $e_{on}$ comprises the component of the inherent offset voltage. As a result, the DC voltage signal $\overline{e_{on}}$ can be obtained at the connection of the resistor 33a and capacitor 34a of the low-pass filter circuit 32, and the DC voltage signal $\overline{e_{op}}$ can be obtained at the connection of the resistor 33b and capacitor 34a of the filter circuit 32. These DC voltage signals $\overline{e_{on}}$ and $\overline{e_{op}}$ comprises the power component $$\left| \frac{\pm e_i e_v}{e_r} \right|$$

and the inherent offset component.

The DC voltage signal $\overline{e_{on}}$ is applied to the analog switch 36a of the voltage-to-frequency converter 35, and the DC voltage signal $\overline{e_{op}}$ is applied to the analog switch 36b of the voltage-to-frequency converter 35. The logic signal $e_f$ of the operational amplifier 40 as a comparator circuit controls the gate of the analog switch 36a. On the other hand, the gate of the analog switch 36b is controlled by the inverted logic signal of the inverter circuit 42. These two switches 36a and 36b do not operate at the same time. As a result, the voltage signal $e_m$ shown in FIG. 6(b) can be obtained at the connection of the two analog switches 36a and 36b.

This voltage signal $e_m$ is applied to the negative input of the operational amplifier 38. Consequently, the triangular signal $e_Q$ in FIG. 6(c) can be obtained at the output of the operational amplifier 38.

This voltage signal $e_Q$ is applied to the negative input of the operational amplifier 40 as a comparator circuit. As shown in FIG. 6(d), when the voltage signal $e_c$ reaches the standard voltage signal $(+e_p/2)$ or $(-e_p/2)$, the output signal of the operational amplifier 40 is inverted by the inverter circuit 42 and the output signal of the inverter circuit 42 is applied to the negative input of the operational amplifier 48 as an integration circuit of the automatic offset compensation circuit 46. As a result, the operational amplifier 48 outputs the feedback voltage signal $e_{nf}$ which eliminates the DC offset voltage $e_{osT}$ of the voltage-to-frequency converter 35 and the feedback voltage signal $e_{nf}$ is applied to the negative input of the operational amplifier 38. The DC offset voltage $e_{osT}$ is automatically eliminated. The operational amplifier 40 of the voltage-to-frequency converter 35 outputs the logic signal $e_f$, which is subject to the frequency $$f_o = \frac{\overline{e_i \cdot e_v}}{2 e_r \cdot e_p \cdot R_2 \cdot C_2}.$$

Therefore the error derived from the DC offset voltage $e_{osT}$ is eliminated. $\frac{1}{2} \cdot e_r \cdot e_p \cdot R_2 \cdot C_2$ is constant. If $\frac{1}{2} \cdot e_r \cdot e_p \cdot R_2 \cdot C_2$ is a constant, the frequency $f_o$ can be expressed as follows:

$$f_o = K \cdot \overline{e_i \cdot e_v} \quad (36)$$

According to the equation (36), the frequency $f_o$ is correctly proportional to the consumption power $\overline{e_i \cdot e_v}$. The display device 50 counts the frequency $f_o$ and indicates the value of the integrated power.

In the example described above, the offset voltage of the PWM circuit 14 and the current-to-voltage converter 25 as obtained through the low-pass filter 32 is the inherent offset voltage which can be eliminated. The automatic offset compensation circuit 46 outputs the feedback signal which eliminates the offset voltage of the voltage-to-frequency converter 35. The feedback signal is applied to the voltage-to-frequency converter 35. The voltage-to-frequency converter 35 can output the frequency signal $f_o$ which is correctly proportional to the consumption power without the influence of the offset voltage. According to this example, when the offset voltage influences highly the accuracy of the measurement and the load is light, the value of the consumption power can be obtained. These circuits are composed by an operational amplifier made of a monolithic IC. This electronic watthour meter can be mass-produced and the size of it can be minimized.

The first example has been described with reference to the single-phase two-line watthour meter. However, with a plurality of voltage detection sections, a plurality of current detection sections and a plurality of multiplication circuits, this invention can be applied to a polyphase watthour meter. In this polyphase watthour meter, the electrical energy is the sum of the powers of the phases. The voltage signals which are proportional to the load voltages of each power line are $e_{v1}, e_{v2}, \ldots, e_{vn}$. The voltage signals which are proportional to the load current of each power line are $e_{i1}, e_{i2}, \ldots, e_{in}$. And, the proportional constants are $K_1, K_2, \ldots K_n$. Accordingly, the power Po will be expressed as follows:

$$Po = k_1 e_{v1} \cdot e_{i1} + K_2 e_{v2} \cdot e_{i2} + \ldots + k_n e_{vn} \cdot e_{in} \quad (37)$$

Similar to the first example of the operation of the multiplication circuit, the output signals of each multiplication circuit are added by the low-pass filter. As a result, the power Po satisfying the equation (37) can be obtained.

Figure 7:
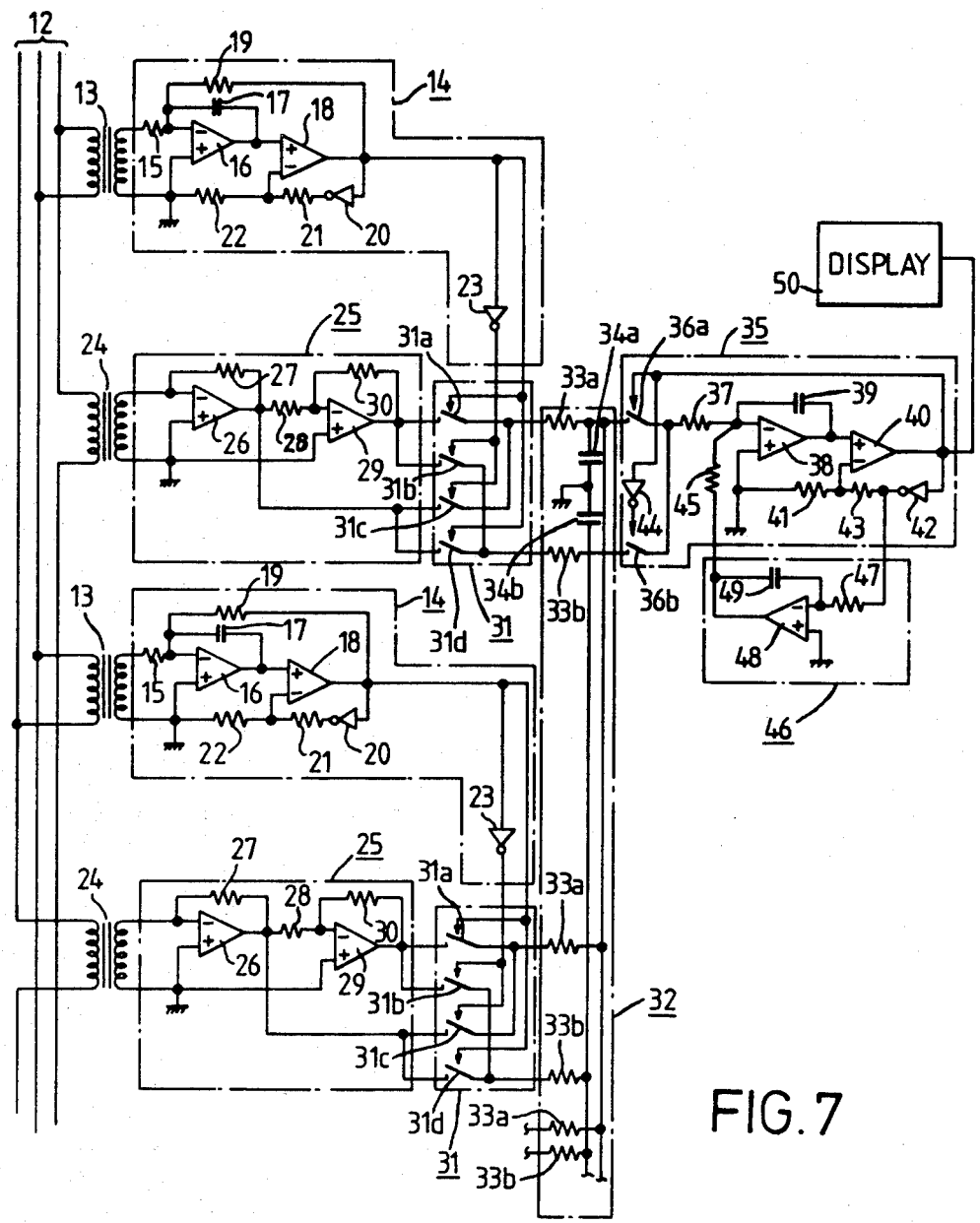
FIG. 7 is a circuit diagram showing a second example of an electronic watthour meter according to the invention.

FIG. 7 is a circuit diagram of the second example of this invention applied to the polyphase watthour meter. In FIG. 7, those components which have previously been described with reference to FIG. 2 have been similarly numbered, and their operations are also similar to those described before. In this second example, a plurality of potential transformers 13, PWM circuits 14, current transformers 24, current-to-voltage converters 25 and multiplication circuits 31 are provided. Through the resistor 33a and the capacitor 33b of the low-pass filter 51, the output signal of each multiplication circuit 31 is applied to the voltage-to-frequency converter 35.

According to this example, the effect similar to the first example can be obtained.

This invention is not limited to the first and second examples described above. In the first and second examples, the voltage signal of the potential transformer 13 is modulated by the PWM circuit. The pulse width duty cycle signals D and $\overline{D}$ of the PWM circuit 14 control the multiplication circuit. However, the voltage signal $e_i$ of the current-to-voltage converter 25 instead of the voltage signal $e_v$ can be modulated by the PWM circuit. Operation similar to the first and second examples can thus be obtained. As a result, a similar effect can be obtained. Many modifications and variations of this invention are possible within the scope of the appended claim.

This invention described above is applied to an electronic watthour meter. Through the low-pass filter 32, the offset voltage of the PWM circuit 14 and the current-to-voltage converter 25 is obtained as the inherent offset voltage which can be eliminated. The feedback signal of the automatic offset compensation circuit 46 is applied to the voltage-to-frequency converter 35 in order to eliminate the offset voltage of the voltage-to-frequency converter 35 and the inherent offset voltage. Accordingly, the influence of the offset voltage can be eliminated. Though the offset voltage has the great influence at the light load, the power can be measured highly accurately. As these circuits are made of IC, the size of this watthour meter can be minimized and it can be mass-produced.

What is claimed is:

1. An electronic watthour meter comprising: first means for detecting a voltage signal proportional to a load voltage of power supply lines; second means for detecting a voltage signal proportional to a load current of said power supply lines; a pulse width modulation circuit for subjecting one of said voltage signals to pulse width modulation to obtain a pulse width duty cycle signal; a multiplication circuit for outputting a pulse signal of the product of said voltage signal from said first means and said voltage signal from said second means by switching operation under the control of said pulse width duty cycle signal; a filter circuit for integrating said pulse signal from said multiplication circuit to positive and negative DC voltages; a voltage-to-frequency converter for outputting a pulse signal, said latter pulse signal having a frequency which is proportional to said DC voltages; and automatic offset compensation circuit means for integrating the voltage of said pulse signal of said voltage-to-frequency converter and applying the resulting integrated voltage to the input of said voltage-to-frequency converter as a feedback signal.

2. The electronic watthour meter according to claim 1, wherein said voltage signal subjected to pulse width modulation is detected by said first means.

3. The electronic watthour meter according to claim 1 or 2, wherein said second means includes a current-to-voltage converter comprising: a first operational amplifier for converting said current signal to a negative voltage signal; and a second operational amplifier for converting said negative voltage signal to a positive voltage signal.

* * * * *